(12) United States Patent
Sperling et al.

(10) Patent No.: US 10,132,874 B2
(45) Date of Patent: Nov. 20, 2018

(54) SYSTEM AND METHOD FOR MONITORING A NICKEL CADMIUM BATTERY IN A PASSENGER AIRCRAFT

(71) Applicant: Lufthansa Technik AG, Hamburg (DE)

(72) Inventors: Florian Sperling, Hamburg (DE); Andrej Guettler, Hamburg (DE)

(73) Assignee: LUFTHANSA TECHNIK AG, Hamburg (DE)

( * ) Notice: Subject to any disclaimer, the term of this patent is extended or adjusted under 35 U.S.C. 154(b) by 0 days.

(21) Appl. No.: 15/320,081

(22) PCT Filed: Jun. 3, 2015

(86) PCT No.: PCT/EP2015/062343
§ 371 (c)(1),
(2) Date: Dec. 19, 2016

(87) PCT Pub. No.: WO2015/193109
PCT Pub. Date: Dec. 23, 2015

(65) Prior Publication Data
US 2017/0139015 A1    May 18, 2017

(30) Foreign Application Priority Data

Jun. 19, 2014 (DE) ........................ 10 2014 211 797

(51) Int. Cl.
*G01N 27/416* (2006.01)
*G01R 31/36* (2006.01)
*G01R 31/00* (2006.01)

(52) U.S. Cl.
CPC ....... *G01R 31/3679* (2013.01); *G01R 31/008* (2013.01); *G01R 31/3624* (2013.01);
(Continued)

(58) Field of Classification Search
CPC .............. G01R 31/008; G01R 31/3624; G01R 31/3658; G01R 31/3679; G01R 31/3689; G01R 31/3675; H02J 7/008; H02J 7/0075
See application file for complete search history.

(56) References Cited

U.S. PATENT DOCUMENTS

| 5,939,861 A | 8/1999 | Joko et al. |
| 6,504,344 B1 | 1/2003 | Adams et al. |

(Continued)

FOREIGN PATENT DOCUMENTS

| DE | 10 2010 041 024 A1 | 3/2012 |
| DE | 10 2012 222 721 A1 | 6/2014 |

(Continued)

OTHER PUBLICATIONS

First Examination Report dated Feb. 6, 2015, issued by the German Patent Office for German Patent Application No. 10 2014 211 797.6.

(Continued)

*Primary Examiner* — Minh N Tang
(74) *Attorney, Agent, or Firm* — Saliwanchik, Lloyd & Eisenschenk

(57) ABSTRACT

A system for monitoring a nickel-cadmium battery incorporating twenty nickel-cadmium battery cells connected in series in a passenger aircraft includes a plurality of cell sensors for measuring the cell voltage and the cell temperature of individual battery cells and a data processing unit, and is set up to measure the battery current. The data processing unit is set up to determine a state of health value which is indicative of the state of health of the battery from the measurement data of the cell sensors and the measured battery current.

20 Claims, 2 Drawing Sheets

(52) U.S. Cl.
   CPC ..... *G01R 31/3658* (2013.01); *G01R 31/3675* (2013.01); *G01R 31/3689* (2013.01)

(56) References Cited

U.S. PATENT DOCUMENTS

| | | |
|---|---|---|
| 9,423,464 B2 | 8/2016 | Aoshima et al. |
| 2010/0179778 A1* | 7/2010 | Goff ................... G01R 31/362 |
| | | 702/64 |
| 2010/0196748 A1* | 8/2010 | Ellwanger ........... H01M 10/425 |
| | | 429/90 |
| 2011/0172939 A1 | 7/2011 | Uprety et al. |
| 2013/0207462 A1 | 8/2013 | Boehm et al. |
| 2013/0245973 A1 | 11/2013 | Ross, Jr. et al. |
| 2014/0229129 A1* | 8/2014 | Campbell ................ H04Q 9/00 |
| | | 702/63 |
| 2015/0325886 A1 | 11/2015 | Butzmann |
| 2015/0369873 A1* | 12/2015 | Nakao ................ G01R 31/3606 |
| | | 702/63 |

FOREIGN PATENT DOCUMENTS

| | | |
|---|---|---|
| WO | WO 2010/134853 A1 | 11/2010 |
| WO | WO 2012/038261 A1 | 3/2012 |
| WO | WO 2013/084353 A1 | 6/2013 |

OTHER PUBLICATIONS

International Search Report for International Patent Application No. PCT/EP2015/062343.

* cited by examiner

SYSTEM AND METHOD FOR MONITORING A NICKEL CADMIUM BATTERY IN A PASSENGER AIRCRAFT

CROSS-REFERENCE TO RELATED APPLICATIONS

The present application is the U.S. National Stage Application of International Patent Application No. PCT/EP2015/062343, filed on Jun. 3, 2015, which claims priority to German Patent Application No. 10 2014 211 797.6, filed on Jun. 19, 2014, both of which are hereby incorporated by reference herein in their entirety, including any figures, tables, or drawings.

FIELD OF THE INVENTION

The invention relates to a system and a method for monitoring a nickel-cadmium battery comprising twenty nickel-cadmium battery cells connected in series in a passenger aircraft.

BACKGROUND OF THE INVENTION

The batteries (main batteries) in a passenger aircraft are important components of the on-board power supply system. For decades, rechargeable nickel-cadmium batteries having a nominal voltage of 24 volts have been used for this purpose, which nickel-cadmium batteries consist of twenty nickel-cadmium battery cells which are connected in series and each have a nominal voltage of 1.2 volts. The batteries are used for example to supply power in emergencies until other redundant power sources become available, to start the auxiliary power unit (APU), and to supply power to sub-systems on the ground for servicing and in preparation for flight. In these cases, strict requirements are placed on safety, reliability and availability, as a result of which servicing intervals are relatively short.

At present, the batteries are removed after a certain number of flight hours (FH) or after a defined period of time has elapsed. The batteries have to be removed from the aircraft and reconditioned in a workshop in order to determine the condition thereof and to carry out maintenance thereon.

However, in their documentation, battery manufacturers always give operational hours (OH) for the servicing intervals. However, since aircraft operators only record flight hours, a factor is defined using the following ratio: factor=OH/FH. This ratio can vary within a particular range depending on the mission profile of the aircraft. The mission profile is calculated using the FH/FC ratio, where FC is the flight cycles, and is classified as being short haul, medium haul or long haul. A relationship to the turnaround time is thus established.

A typical cycle of an aircraft battery, which is removed after the applicable time limit has elapsed, is for example storage-installation-operation in aircraft-removal-maintenance-storage. Measures taken during the maintenance stage are for example: periodic checks, including for example insulation measurements, voltage measurements and filling level measurements; regular checks including periodic checks and capacity tests; and general overhaul including regular checks and cleaning.

In an aircraft, it is conventionally only the total voltage and the charging or discharging current that is recorded. Furthermore, in some types of batteries, a temperature is also measured at a central measuring point. These data are not analysed or combined in the aircraft, it being impossible in any case to reach a satisfactory conclusion on the state of ageing of the battery on the basis of these data.

In the workshop, the state of health (SoH) of an aircraft battery, as set out by the manufacturer in the component maintenance manual, is determined using the insulation values, the cell voltage during loading, the filling level of the electrolyte and the capacity. There are doubts as to the validity of this method in respect of the state of health. If the aircraft battery passes the capacity test without any difficulty, it is deemed to be in working order irrespective of the operating condition of individual cells and can thus be installed in the aircraft. In this way, weakened cells go undetected and sustain further damage during continued operation. If the fault is later detected during maintenance operations, the battery should be disposed of if there is a low number of faulty battery cells, for example five. In any case, weak points or potential faults in a battery which is in use are not detected or remedied until maintenance is carried out in the workshop, if at all. These faults are thus dormant faults; it is not possible to detect these faults at an early stage or in a timely manner. Therefore, no preventative measures can be taken either in order to counteract irreparable damage and the associated requirement of permanently taking individual battery cells or the whole battery out of operation.

In the worst case scenario, the capacity required in an emergency, which should ensure that there is an emergency power supply for 30 minutes, cannot be drawn from a battery that has been previously damaged in this manner, and this can have an adverse effect on flight safety.

Historical analysis demonstrates that nickel-cadmium batteries used in aircraft are very reliable components. The number of times that the batteries are removed when undamaged is therefore relatively high, resulting in unnecessary effort. An analysis of a particular type of passenger aircraft carried out in 2012 showed for example that only a particular proportion of the removed batteries had a dormant fault which had not been detected during operation in the aircraft. Therefore, a fault was not found in many of the removed batteries, and therefore said batteries would not have needed to be removed.

If a battery cell weakens steadily over time, the other battery cells are loaded more heavily and may likewise become damaged. This imbalance between the individual battery cells cannot be detected from the outside. Even the tests required by the manufacturer only inadequately identify weakened battery cells. This increases the need to take whole batteries out of operation unnecessarily because a plurality of battery cells may already have a serious defect at the time when the fault is discovered.

Another drawback is that there is no universal standard for the removal of batteries. Each operator establishes, in consultation with system developers, the servicing intervals after which a battery should be removed. Empirical values and manufacturer recommendations form the basis of this decision. A solid database in the form of continuously collected measurement values does not currently exist. This poses a risk in respect of the evaluation of the state of ageing of the batteries.

The object of the invention is that of providing a system and a method for monitoring an aircraft battery which provide for cost-effective and efficient servicing and maintenance, increase the average operational life of the batteries and flight safety, and reduce the amount of irreparable damage to the batteries.

This object is achieved according to the invention by the features of the independent claims.

BRIEF SUMMARY OF THE INVENTION

According to the invention, a plurality of cell sensors and a data processing unit are provided, which cell sensors are intended for measuring the cell voltage and the cell temperature of the individual battery cells, the system being set up to measure the battery current, and the data processing unit being set up to determine a state of health value which is indicative of the state of health of the battery from the measurement data of the cell sensors and the measured battery current. Battery current is understood to mean the amperage of the current flowing between the battery poles. The invention makes it possible to provide a continuous, cell-based conclusion on the current state of ageing or state of health (SoH) of an aircraft battery, and therefore precise information of the current state of health of the battery is always provided. As a result of the invention, the batteries no longer have to be removed from the aircraft for regular monitoring, but are instead only removed and subject to maintenance on demand or when a fault is indicated on the basis of the state of health value determined according to the invention. Given that, according to the invention, it is possible to detect any faults or fatigue of individual battery cells at an early stage, dormant faults can be largely avoided during operation in flight, which contributes to increasing flight safety. The reduction in the number of times batteries are removed results in costs being significantly lowered in the long term. The average time between two removal operations (mean time between removal, MTBR) can be significantly increased. As a result of faults being detected at an early stage, unhealthy batteries can be replaced as a preventative measure and subject to maintenance in a timely manner before the damage becomes irreparable as a result of further loading, which reduces the number of times batteries have to be permanently taken out of operation or scrapped. Owing to the information relating to the state of health of the individual battery cells, the search for faults is simplified, which provides for quicker and more efficient maintenance and servicing. The invention makes it possible to establish a uniform and objective standard for the removal of aircraft batteries.

In addition to the state of health value, there is the option of identifying the state of charge (SoC) of the individual battery cells from the measured cell voltages.

Each battery cell of the battery is preferably associated with a corresponding cell sensor so as to provide for information relating to the state of health of the battery that is differentiated and specific to the cells. The battery current can be measured using a current measuring device and/or directly by means of the data processing unit. It is thus possible to detect an error in individual cells even though the overall condition of the battery is satisfactory. It is thus possible to change the battery as a precautionary measure so as to prevent the error from becoming more severe.

During loading of the battery, in particular during high-current loading, the internal resistance of the individual cells is advantageously calculated from the ratio of cell voltage to battery current. In particular during high-current events, such as starting an auxiliary power unit of the aircraft, meaningful measurement values can be recorded, e.g. the internal resistance of the battery.

The data processing unit is preferably set up to take into consideration one or more of the following parameters when calculating the state of health value: the instantaneous load of the battery; the current state of charge of the battery cells; the temperature of the battery cells; the number of charging cycles; the number of operational hours OH; the filling levels of the battery cells; and the insulation of the battery cells. This is because these factors have a more or less significant influence on the internal resistance of a nickel-cadmium cell. This is based on the knowledge that the state of health of a battery is substantially dependent on the internal resistance of each individual battery cell.

Using the battery management system according to the invention, significant influencing factors can be collected either directly or by suitably combining the collected or recorded measurement values. In this manner, the filling level of individual battery cells for example can advantageously be determined from the charging current, the cell voltage and the cell temperature. The insulation of a battery cell can in turn be determined from the determined filling level of this battery cell. Additionally or alternatively, the insulation of a battery cell can be measured by measuring a leakage current between battery terminals and the battery housing. The number of operational hours OH and/or the number of charging/discharging cycles of the battery can be determined from the continuously measured charging/discharging current of the battery.

The determined state of health can preferably be read directly on the battery if a display is advantageously provided on the battery for the determined state of health value. In a simple embodiment, this can be done for example by means of a plurality of lamps or luminous states which are differently coded, for example by colour. The battery can also be preferably connected to a communications bus (e.g. maintenance bus) in the aircraft in order to transmit the state of health value or information relating thereto to the cockpit in particular and/or the on-board diagnosis system.

It is particularly advantageous for the cell sensors and the data processing unit to be set up to communicate with one another wirelessly. The battery monitoring system (BMS) according to the invention thus consists of a wireless sensor network which continuously monitors the aircraft battery, e.g. at regular time intervals and/or in an event-controlled manner.

The cell sensors, the current measuring device and/or the data processing unit are preferably integrated in the battery or arranged in a battery housing. Alternatively, each cell sensor can also be arranged in one battery cell. In this case, the battery is a separate unit which can automatically reach a conclusion on the state of health thereof and optionally visually display this conclusion without referring to devices of the aircraft that are outside the battery.

Another aspect of the invention relates to a method for monitoring a nickel-cadmium battery comprising twenty nickel-cadmium battery cells connected in series in a passenger aircraft, comprising the steps of: measuring the cell voltage and the temperature of the individual battery cells, measuring the battery current, and determining a state of health value which is indicative of the state of health of the battery from the measurement data in a data processing unit.

BRIEF DESCRIPTION OF THE FIGURES

The invention will be described in more detail below by way of preferred embodiments and with reference to the accompanying figures, in which.

DETAILED DESCRIPTION OF THE INVENTION

A passenger aircraft 10 comprises at least one, generally a plurality of aircraft batteries 11 (main batteries), which are part of the on-board electrical system (aircraft electrical system). The aircraft batteries 11 are used in particular to start an auxiliary power unit 13 (APU) and optionally a main engine 12 and to provide an autonomous power supply on the ground when a ground-based power supply is not available and in flight if the electric generators malfunction or fail.

Figure 2:
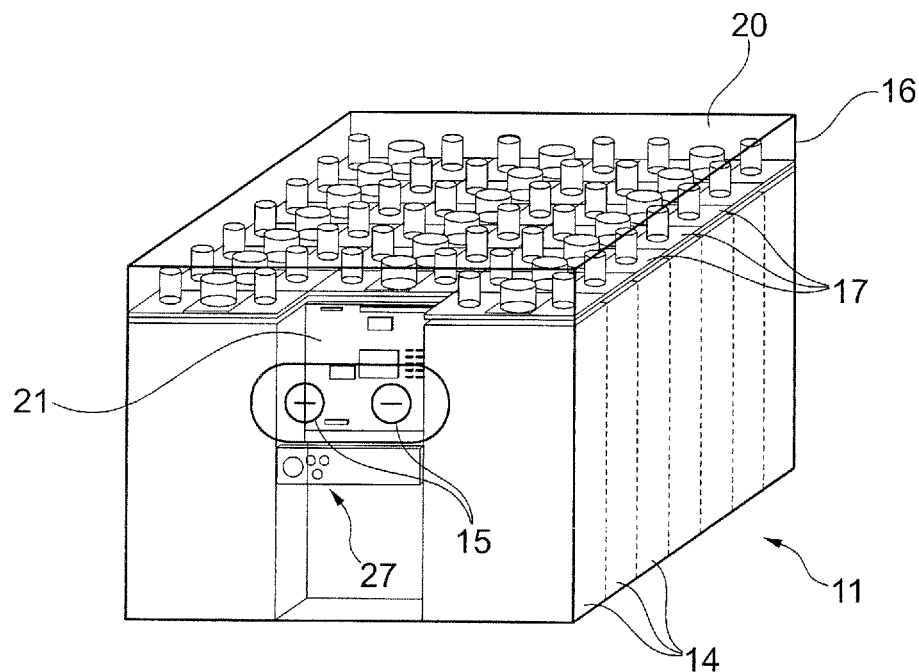
FIG. 2 is a perspective view of an aircraft battery.

A nickel-cadmium battery 11 according to the invention is shown in detail in FIG. 2. The aircraft battery 11 comprises twenty nickel-cadmium battery cells 14 connected in series, which are arranged in this figure by way of example in three rows comprising seven, six and seven battery cells 14, respectively; however, this arrangement is not limiting. Since a nickel-cadmium battery cell 14 has a nominal voltage of 1.2 V, the battery 11 has a nominal voltage of 24 V owing to the series connection. The battery cells 14 are arranged in a battery housing 16 (box) which is for example box-shaped, can usually be closed by means of a cover 20 and comprises a handle for example for carrying the battery 11. The battery 11 comprises, as is conventional, two battery poles which can be connected via appropriate connections 15 to the battery housing 16 by means of a power cable so as to draw electricity from the battery 11.

Each battery cell 14 is associated with its own cell sensor 17 which comprises sensor elements for measuring the cell voltage, i.e. the voltage applied by the associated battery cell 14, and for measuring the cell temperature, i.e. the prevailing temperature in the associated battery cell 14. The cell sensors 17 are thus decentralised because they are each associated with just one battery cell 14 instead of the whole battery 11. The cell sensors 17 can be in the form of suitable electronic components on a printed circuit board. The cell sensors 17 are preferably set up for wireless communication and therefore preferably comprise a radio antenna 18 which is designed for example as a printed circuit board antenna, and a radio module 19 which is connected to the radio antenna 18. The sensors are thus wireless cell sensors 17. The cell sensors 17 are advantageously arranged within the battery housing 16. The cell sensors 17 can also preferably be connected to a data acquisition/data processing unit 21 by means of cables.

Figure 3:
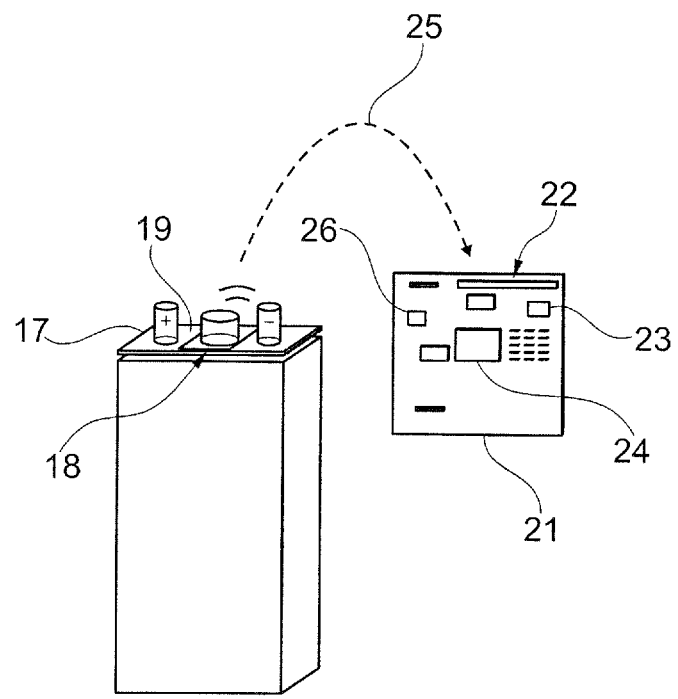
FIG. 3 is a schematic view of a radio link between a battery cell and a data processing unit.

The battery 11 also comprises the (battery) central data acquisition/data processing unit 21 which comprises a microprocessor or microcontroller 24 and is set up to receive data measured by all of the cell sensors 17. The data acquisition/data processing unit 21 is preferably set up to communicate wirelessly with the cell sensors 17 and for this purpose preferably comprises a radio antenna 22 and a radio module 23 which is connected to the radio antenna 22. By way of example, FIG. 3 shows the wireless uplink radio link 25 between a cell sensor 17 and the data acquisition/data processing unit 21, all of the cell sensors 17 having a radio link 25 of this type to the data acquisition/data processing unit 21, as is described above. The data acquisition/data processing unit 21 and the cell sensors 17 thus form a wireless sensor network.

The data acquisition/data processing unit 21 can be in the form of suitable electronic components on a printed circuit board, in particular in the form of a data acquisition and computation card (DACC). The data acquisition/data processing unit 21 is preferably arranged within the battery housing 16.

The battery 11 also comprises a current measuring device 26 which is preferably formed in the data acquisition/data processing unit 21, in particular by suitable electronic components, and is set up to measure the (total) current flowing through the battery 11. In one embodiment, the current measuring device 26 can also be set up to measure the leakage currents between the battery terminals 15 and the battery housing 16.

The cell sensors 17 measure both the cell voltage and the temperature of the associated battery cell 14 in a decentralised and advantageously continuous manner and transmit these measurement values to the data acquisition/data processing unit 21 in an advantageously wireless manner. The current measuring device 26 measures the battery current in a central and advantageously continuous manner. In one embodiment, the current measuring device 26 also measures the aforementioned leakage currents in an advantageously continuous manner, in particular in order to determine the insulation values of the battery 11 from said leakage currents.

On this basis of all of the data that are advantageously always available, the data acquisition/data processing unit 21 determines a state of health value which is indicative of the state of health of the battery 11. This will be explained in more detail below.

The state of health (SoH) of the battery 11 is substantially determined from the internal resistance of each individual battery cell 14. When the battery 11 is loaded, the internal resistance can be calculated at a particular point in time from the ratio of the cell voltage measured by the cell sensor 17 to the total current measured by the current measuring device 26. In particular during high-current events, such as starting the auxiliary power units 13, meaningful measurement values can be recorded.

The internal resistance of battery cells is a non-linear and dynamic system. The internal resistance of the nickel-cadmium cells 14 depends to a greater or lesser extent on the following factors in particular:

the instantaneous load of the battery 11;
the current state of charge of the battery cells 14;
the temperature of the battery cells 14;
the number of charging cycles;
the number of operational hours OH;
the filling levels of the battery cells 14;
the insulation of the battery cells 14.

Therefore, these factors are advantageously taken into consideration in order to reliably determine the state of ageing SoH of the battery cells 14. Using the aforementioned battery management system, the influencing factors above can be derived either directly (instantaneous load from the measured battery current; current state of charge of a battery cell 14 from the measured cell voltage; cell temperature) or by suitably combining the collected or recorded measurement values:

The filling level of the battery cells 14 can be determined using the current, the cell voltage and the cell temperature: when a nickel-cadmium cell 14 is overcharged, hydrogen and oxygen are formed, which escape from the cell. The proportion of distilled water in the electrolyte reduces, and so the filling level lowers. Water consumption therefore correlates with the metrologically determinable duration of overcharging.

The insulation is substantially dependent on electrolyte residue in the form of crystalline deposits (potassium carbonate). Owing to the conductivity thereof, these deposits result in leakage currents between the battery terminals 15 and the battery housing 16. The insulation can be determined indirectly using the determined filling level or optionally using metrology if the current measuring device 26 is set up to measure the leakage currents.

The actual operational hours (OH) in which the battery 11 is loaded can be measured using the charging and discharging current. This is therefore directly related to the specifications of the battery manufacturer. There is also the option of counting the charging and discharging cycles.

In an advantageous embodiment, the determined state of health value is visually displayed by a plurality of coloured lamps 27 which are preferably arranged outside the battery housing 16. In one embodiment, these can be three lamps 27 of different colours, for example red, orange and green LEDs. When the state of health value is in a middle range, the orange LED indicates that the battery 11 should be changed at the next opportunity. Conversely, when the state of health value is below a critical value, the red LED indicates that the battery 11 is no longer airworthy and should therefore be changed immediately. When the state of health value is above a corresponding threshold, the green LED indicates that the battery 11 is healthy. Two lamps 27 having different colours (for example red/green) may also suffice, and more than three colour codes can likewise be used to provide for differentiated information on the state of health. The lamps 27 can be activated by a servicing engineer for example.

Figure 1:
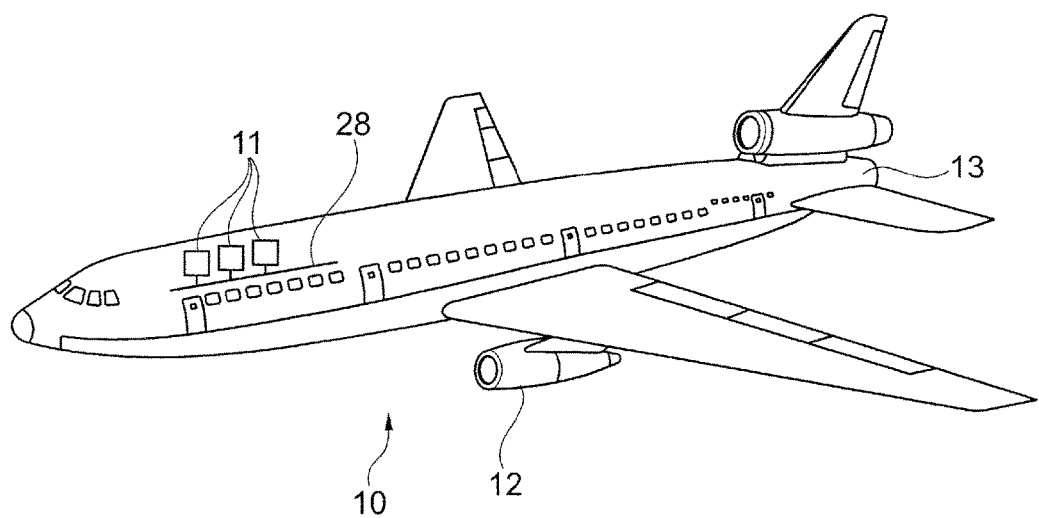
FIG. 1 is a schematic drawing of a passenger aircraft.

Another option is to connect the data acquisition/data processing unit 21 to a data bus 28 of the aircraft (see FIG. 1), for example an ARINC 429 data bus. The determined state of health value or a warning relating thereto can be sent to the cockpit for example.

The data acquisition/data processing unit 21 can advantageously monitor whether it and/or the battery management system is functioning properly by means of a test device (built-in test equipment, BITE). If, for example, a cell sensor 17 does not transmit any data, the data acquisition/data processing unit 21 will become aware of and visually display this fact by means of a corresponding fault signal. One of the lamps 27 can optionally be used for this fault signal, for example the orange LED.

EMBODIMENTS

Embodiment 1

System for monitoring a nickel-cadmium battery (11) comprising twenty nickel-cadmium battery cells (14) connected in series in a passenger aircraft (10), characterised in that the system comprises a plurality of cell sensors (17) and a data processing unit (21), which cell sensors are intended for measuring the cell voltage and the cell temperature of individual battery cells (14), and said system is set up to measure the battery current, the data processing unit (21) being set up to determine a state of health value which is indicative of the state of health of the battery (11) from the measurement data of the cell sensors (17) and the measured battery current.

Embodiment 2

System according to Embodiment 1, characterised in that each battery cell (14) of the battery (11) is associated with a corresponding cell sensor (17).

Embodiment 3

System according to either Embodiment 1 or Embodiment 2, characterised in that, during loading, in particular during high-current loading, the internal resistance of the individual battery cells (14) is calculated from the ratio of cell voltage to battery current.

Embodiment 4

System according to any of the preceding Embodiments, characterised in that the data processing unit (21) is set up to take into consideration one or more of the following parameters when calculating the state of health value:
the instantaneous load of the battery (11);
the current state of charge of the battery cells (14);
the temperature of the battery cells (14);
the number of charging cycles;
the number of operational hours OH;
the filling levels of the battery cells (14);
the insulation of the battery cells (14).

Embodiment 5

System according to any of the preceding Embodiments, characterised in that the filling level of individual battery cells (14) is determined from the battery current, the cell voltage and the cell temperature.

Embodiment 6

System according to any of the preceding Embodiments, characterised in that the insulation of a battery cell (14) is determined from the filling level of this battery cell (14).

Embodiment 7

System according to any of the preceding Embodiments, characterised in that the insulation of the battery (11) is determined from a measured leakage current between the battery terminals (15) and the battery housing (16).

Embodiment 8

System according to any of the preceding Embodiments, characterised in that the number of operational hours OH and/or the number of charging/discharging cycles of the battery (11) is determined from the continuously measured charging/discharging current of the battery (11).

Embodiment 9

System according to any of the preceding Embodiments, characterised in that a display (27) is provided on the battery (11) for the determined state of health value.

Embodiment 10

System according to Embodiment 9, characterised in that the display (27) has a plurality of lamps or luminous states which are differently coded, for example by colour, depending on the state of health value.

Embodiment 11

System according to any of the preceding Embodiments, characterised in that the data processing unit (21) is set up for connection to a data bus (28) of the aircraft (10).

Embodiment 12

System according to any of the preceding Embodiments, characterised in that the cell sensors (17) and the data processing unit (21) are set up to communicate with one another wirelessly.

Embodiment 13

System according to any of the preceding Embodiments, characterised in that the battery (11) comprises a test device for testing that the system is functioning properly.

Embodiment 14

System according to any of the preceding Embodiments, characterised in that the cell sensors (17), the current measuring device (26) and/or the data processing unit (21) are arranged inside a battery housing (16).

Embodiment 15

Method for monitoring a nickel-cadmium battery (11) comprising twenty nickel-cadmium battery cells (14) connected in series in a passenger aircraft (10), characterised in that the method comprises the following steps: measuring the cell voltage and the temperature of the individual battery cells (14), measuring the battery current, and determining a state of health value which is indicative of the state of health of the battery (11) from the measurement data in a data processing unit (21).

The invention claimed is:

1. A system for monitoring a battery having multiple battery cells connected in series, comprising:
   a plurality of cell sensors;
   a current measuring device; and
   a data processing unit,
   wherein the system is configured to interconnect with a battery having multiple battery cells connected in series, such that when the system is interconnected with the battery:
      the plurality of cell sensors are configured to continuously measure a corresponding cell voltage of each battery cell of the battery and continuously measure a corresponding cell temperature of each battery cell of the battery;
      the current measuring device is configured to continuously measure a battery current of the battery, where the battery current of the battery is a total current flowing through the battery; and
      the data processing unit is configured to receive the cell voltage of each battery cell of the battery, receive the cell temperature of each battery cell of the battery, receive the battery current, and determine a state of health value that is indicative of a state of health of the battery from the cell voltage of each battery cell of the battery, the cell temperature of each battery cell of the battery, and the battery current,
   wherein a filling level of the each battery cell of the battery is determined from:
      the cell voltage of the each battery cell of the battery;
      the cell temperature of the each battery cell of the battery; and
      the battery current of the battery,
   wherein a reduction of a proportion of distilled water in an electrolyte of the each battery cell of the batten, results in a lowering of the filling level of the each battery cell of the battery, and correlates with a duration of overcharging of the each battery cell of the battery.

2. The system according to claim 1,
   wherein when the system is interconnected with the battery, each battery cell of the battery is associated with a corresponding cell sensor of the plurality of cell sensors, such that each cell sensor of the plurality of cell sensors measures the cell voltage of a corresponding battery cell of the battery and measures the cell temperature of the corresponding battery cell of the battery.

3. The system according to claim 2,
   wherein the system is configured such that, during loading of the battery:
      each cell sensor of the plurality of cell sensors measures a loading cell voltage of the corresponding battery cell of the battery; and
      the current measuring device measures a loading battery current of the battery, and
   wherein the data processing unit is configured to:
      receive the loading cell voltage of each battery cell of the battery;
      receive the loading battery current of the battery; and
      determine a corresponding internal resistance of each battery cell of the battery,
   where the internal resistance of the each battery cell of the battery is a ratio of the loading cell voltage of the each battery cell of the battery to the loading battery current of the battery.

4. The system according to claim 2,
   wherein the battery is a nickel-cadmium battery.

5. The system according to claim 4,
   wherein the nickel-cadmium battery has twenty nickel-cadmium battery cells connected in series.

6. The system according to claim 4,
   wherein the data processing unit is configured to take into consideration one or more of the following parameters when determining the state of health value:
   an instantaneous load of the battery;
   a corresponding current state of charge of each battery cell of the battery;
   the cell temperature of each battery cell of the battery;
   a number of charging and discharging cycles of the battery;
   a number of operational hours of the battery;
   a corresponding filling level of each battery cell of the battery;
   a corresponding insulation of each battery cell of the battery; and
   an insulation of the battery.

7. The system according to claim 6,
   wherein the insulation of the each battery cell of the battery is determined from the filling level of the each battery cell of the battery.

8. The system according to claim 6,
   wherein the insulation of the battery is determined from leakage currents measured between battery terminals of the battery and a battery housing of the battery.

9. The system according to claim 6,
   wherein the number of operational hours of the battery and/or the number of charging and discharging cycles of the battery is determined from the battery current of the battery.

10. The system according to claim 6, further comprising:
    a display,
    wherein the state of health value is displayed on the display.

11. The system according to claim 10,
wherein the display has a plurality of lamps or luminous states that are differently coded depending on the state of health value.

12. The system according to claim 2,
wherein the plurality of cell sensors and the data processing unit are configured to communicate with each other wirelessly.

13. The system according to claim 2, further comprising:
a test device,
wherein the system is configured to utilize the test device to test whether the system is functioning properly.

14. A battery system, comprising:
the system according to claim 2; and
the battery,
wherein the system is configured to interconnect to the battery such that the plurality of cell sensors, the current measuring device, and/or the data processing unit are arranged inside a battery housing of the battery.

15. A method for monitoring a battery having multiple battery cells connected in series, comprising:
providing the system for monitoring a battery having multiple battery cells connected in series according to claim 1;
interconnecting the system with a battery having multiple battery cells connected in series;
continuously measuring a corresponding cell voltage of each battery cell of the battery and a corresponding cell temperature of each battery cell of the battery via the plurality of cell sensors;
continuously measuring a battery current of the battery via the current measuring device; and
determining a state of health value that is indicative of the state of health of the battery from the cell voltage of each battery cell of the battery, the cell temperature of each battery cell of the battery, and the battery current, via the data processing unit,
determining a filling level of the each battery cell of the battery from:
the cell voltage of the each battery cell of the battery;
the cell temperature of the each battery cell of the battery; and
the battery current of the battery,
wherein a reduction of a proportion of distilled water in an electrolyte of the each battery cell of the battery results in a lowering of the filling level of the each battery cell of the battery, and correlates with a duration of overcharging of the each battery cell of the battery.

16. The method according to claim 15,
wherein the battery is a nickel-cadmium battery.

17. The method according to claim 16,
wherein when the system is interconnected with the battery, each battery cell of the battery is associated with a corresponding cell sensor of the plurality of cell sensors, such that each cell sensor of the plurality of cell sensors measures the cell voltage of a corresponding battery cell of the battery and measures the cell temperature of the corresponding battery cell of the battery,
wherein the battery has twenty nickel-cadmium battery cells, and
wherein the battery is located in an aircraft.

18. An aircraft, comprising:
the system according to claim 1.

19. The aircraft according to claim 18,
wherein the data processing unit is configured to connect to a data bus of the aircraft.

20. The aircraft according to claim 18,
wherein the battery is a nickel-cadmium battery.

* * * * *